United States Patent [19]

Fitzpatrick et al.

[11] Patent Number: 4,958,089

[45] Date of Patent: Sep. 18, 1990

[54] HIGH OUTPUT DRIVE FET BUFFER FOR PROVIDING HIGH INITIAL CURRENT TO A SUBSEQUENT STAGE

[75] Inventors: Mark F. Fitzpatrick, San Jose; Gary R. Gouldsberry, Cupertino, both of Calif.

[73] Assignee: Gazelle Microcircuits, Inc., Santa Clara, Calif.

[21] Appl. No.: 287,320

[22] Filed: Dec. 20, 1988

[51] Int. Cl.$^5$ .................................................. H03K 19/017
[52] U.S. Cl. .................................. 307/448; 307/443; 307/450; 307/475
[58] Field of Search ................ 307/443, 448, 450–451, 307/475, 304, 584–585

[56] References Cited

U.S. PATENT DOCUMENTS

| | | | |
|---|---|---|---|
| 4,701,643 | 10/1987 | Laude et al. | 307/450 |
| 4,743,782 | 5/1988 | Nelson et al. | 307/448 X |
| 4,768,830 | 11/1988 | Foss | 307/475 |
| 4,810,969 | 3/1989 | Fulkerson | 307/443 X |
| 4,825,106 | 4/1989 | Tipon et al. | 307/443 X |
| 4,831,284 | 5/1989 | Anderson et al. | 307/448 X |

FOREIGN PATENT DOCUMENTS

| | | | |
|---|---|---|---|
| 0180330 | 9/1985 | Japan | 307/448 |
| 0005621 | 1/1986 | Japan | 307/448 |

Primary Examiner—David Hudspeth
Attorney, Agent, or Firm—Skjerven, Morrill, MacPherson, Franklin & Friel

[57] ABSTRACT

An output buffer provides high current at an output for only a brief period, while after this brief period the output buffer only supplies a limited amount of current to the subsequent stage. One embodiment of this inventive output buffer utilizes the inherent delay of an inverter and a high current FET device, arranged to form a feedback circuit, to switch off high current supplied to the subsequent stage afer a brief period. This brief period allows the output of the output buffer to supply the necessary current and voltage to switch the subsequent stage. A low current FET device in the output buffer then provides the necessary low current to maintain the state of the subsequent stage without supplying current unnecessary for the proper operation of the subsequent stage.

27 Claims, 2 Drawing Sheets

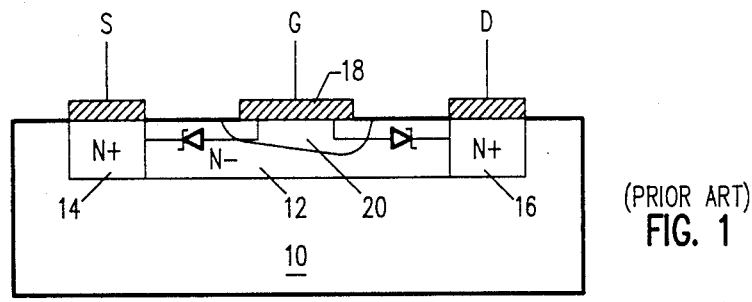
(PRIOR ART)
FIG. 1
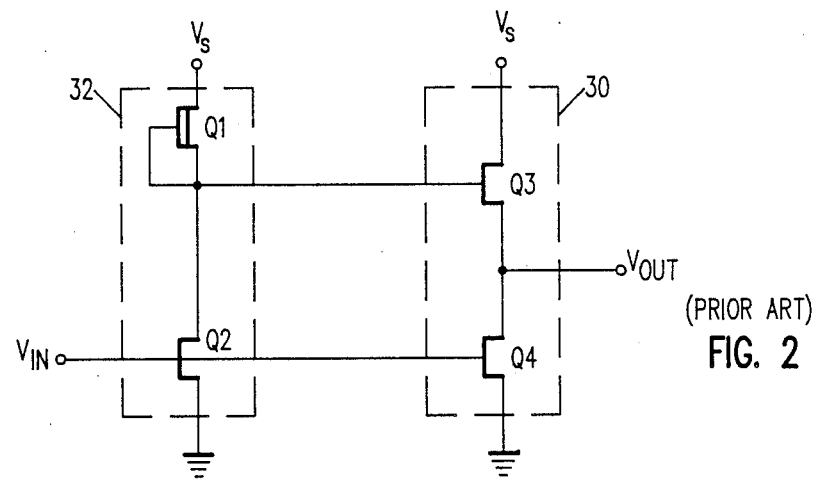
(PRIOR ART)
FIG. 2
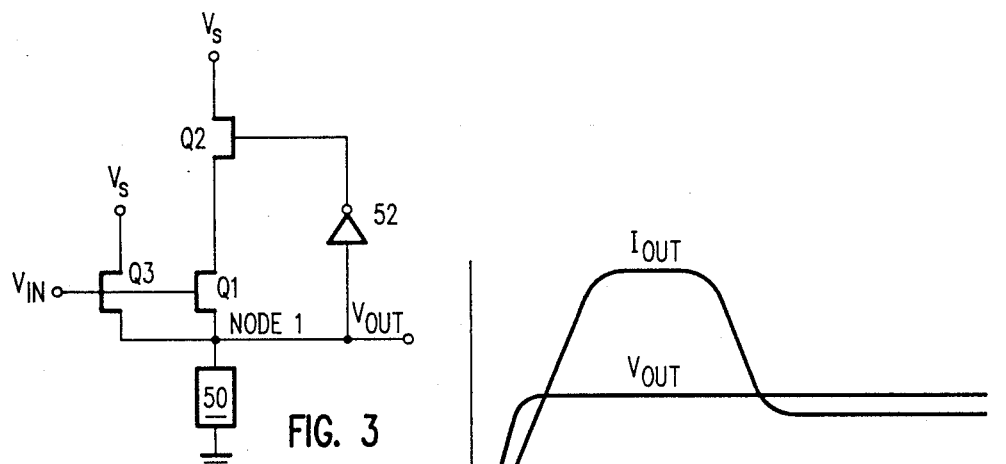
FIG. 3
FIG. 4

HIGH OUTPUT DRIVE FET BUFFER FOR PROVIDING HIGH INITIAL CURRENT TO A SUBSEQUENT STAGE

FIELD OF THE INVENTION

This invention relates to output buffers and in particular to an energy efficient output buffer which can provide a high current drive signal to a subsequent stage.

BACKGROUND OF THE INVENTION

Typically, very fast high current output buffers are desired in logic circuits to drive a subsequent stage. The high current output of the buffer is necessary to quickly change the state of any subsequent stage since, if a subsequent stage has an inherent input capacitance, the capacitance must first be adequately charged to switch the subsequent stage. Total load capacitance may result from the capacitance of interconnect lines and/or the capacitance of the subsequent stage itself. For example, if the input device of a subsequent stage is a MOSFET, sufficient charge must first be applied to the gate of the MOSFET in order to turn on the MOSFET. Thus, an output buffer must quickly provide this charge to the gate of the MOSFET. This problem with capacitance also exists with devices incorporating diodes, which have a small inherent capacitance.

Further, even if the effect of the capacitance of a subsequent stage is neglected, the output voltage of the buffer must still first rise to a certain minimum voltage to switch the subsequent stage. As an example, if the input to the subsequent stage is a diode, or other voltage clamping device, coupled to ground, the output buffer must first rise to a voltage equal to the voltage drop of the clamping device in order to switch the subsequent stage. The current provided by the output buffer to cause the desired voltage drop is typically greater than necessary to maintain the desired voltage drop since, to provide fast switching, high current transistors are used in the output buffer. If the clamping device is a diode, once the current provided to the diode has risen sufficiently to drop about 0.7 volts across the diode, any higher level of current provided by the output buffer through the clamping diodes is wasted as heat. This is inefficient, yet being done in the prior art.

Frequently, a clamped voltage is desired as an input into a subsequent stage to limit voltage swing. This can result in improved switching speed and lower dynamic power consumption. Therefore, the problem discussed above with respect to clamped voltages can be encountered in the prior art even if the input of the subsequent stage does not inherently clamp the signal.

The problem of wasted current also occurs if the input device of the subsequent stage is a gallium arsenide (GaAs) MESFET. A simple GaAs MESFET is shown in FIG. 1, wherein an undoped GaAs substrate 10 has a top N− layer 12 having formed in it N+ source region 14 and N+ drain region 16. On the top surface of the device between source region 14 and drain region 16 is formed a Schottky metal contact 18 which forms a Schottky diode with N− layer 12. In order to prevent current from flowing between source region 14 and drain region 16, the Schottky diode is reverse biased, causing a depletion region 20 to extend down into N− layer 12, eventually cutting off all current between source region 14 and drain region 16.

Since, typically, source region 14 is connected to ground potential and drain region 16 is at a positive voltage, any voltage applied to Schottky metal 18 above about 0.5 volts in order to fully turn on the MESFET will cause the Schottky diode to be forward biased with respect to source region 14. Therefore some current will flow through the Schottky diode when the MESFET is biased in its on state. The inherent Schottky diodes in the MESFET are shown within N− layer 12.

Thus, the problems discussed above with respect to the input of the subsequent gate being a diode are also present when the input into the subsequent stage is a GaAs MESFET device. That is, once sufficient voltage has been provided to the Schottky metal 18 to reduce the depletion region in N− layer 12 in order to bias the GaAs MESFET in its on state, the output buffer continues to supply a wasteful high current through the Schottky diode. The prior art output buffer designers have deemed it a desirable tradeoff to continue to supply this high current output to switch the MESFET because of the fast switching obtained.

Typically, a low power input signal is applied to the input of the output buffer, where the low power input signal is not sufficient to provide the desired fast switching response of the subsequent stage.

FIG. 2 shows representative output buffer 30 used in the prior art. Inverter 32 is shown coupled to output buffer 30 to cause transistors Q3 and Q4 of output buffer 30 to be in opposite states. In FIG. 2, depletion type FET transistor Q1 is coupled in series with transistor Q2 between supply voltage $V_s$ and ground. The gate of transistor Q1 is coupled to its source, and the gate of transistor Q2 is coupled to input signal $V_{in}$. $V_{in}$ is also coupled to the gate of transistor Q4. The common terminals of transistors Q1 and Q2 are coupled to the gate of transistor Q3. Transistors Q2 and Q3 are also coupled in series between supply voltage $V_s$ and ground. Output voltage $V_{out}$ is taken from the common terminals of transistors Q3 and Q4.

The operation of the buffer of FIG. 2 is as follows. As a starting state, assume $V_{in}$ is high and output voltage $V_{out}$ is low. Assuming the input device of a subsequent stage, coupled to $V_{out}$, is an N-channel device, the subsequent stage input device will not be switched on since $V_{out}$ is low. When $V_{in}$ changes to a low state, transistor Q2 will be turned off, allowing the source and gate of transistor Q1 to rise to a high voltage. The low $V_{in}$ voltage also being applied to the gate of transistor Q4 will cause transistor Q4 to be switched off, while the high voltage applied to the gate of transistor Q3 will cause transistor Q3 to conduct. Thus, $V_{out}$ is pulled up to near the supply voltage $V_s$, and a high current can now flow through transistor Q3.

When the high voltage $V_{out}$ is applied to the input device of a subsequent stage, and the input device of the subsequent stage is a clamping type load such as a diode or MESFET load, such as the GaAs MESFET of FIG. 1, a relatively high current is continuously being fed to the clamping load. This high current, as previously discussed, is more than what is necessary to maintain the desired voltage across the clamping load. This wasted current may be manifested as heat which must be controlled so as to not have deleterious effects on the various electrical components.

In inverter 32 of FIG. 2, transistors Q1 and Q2 are typically small to conserve surface area, and transistors Q3 and Q4 are large to provide the desired fast switching and high current to the subsequent stage.

SUMMARY OF THE INVENTION

The present invention is an output buffer which provides all the advantages of a fast switching, high current output buffer without supplying unnecessary current to a subsequent stage. Thus, this inventive buffer is energy efficient and does not cause excessive heat to be generated due to the unnecessary current. The output buffer functions to provide high current at an output for only a brief period, while after this brief period the output buffer only supplies a limited amount of current to the subsequent stage. One embodiment of this inventive output buffer utilizes the inherent delay of an inverter and a high current FET device, arranged to form a feedback circuit, to switch off high current supplied to the subsequent stage after a brief period. This brief period allows the output of the output buffer to supply the necessary current and voltage to switch the subsequent stage. A low current FET device in the output buffer then provides the necessary low current to maintain the state of the subsequent stage without supplying current unnecessary for the proper operation of the subsequent stage.

BRIEF DESCRIPTION OF THE DRAWINGS

FIG. 1 shows a cross-section of a GaAs MESFET.

FIG. 2 is a schematic diagram of a representative prior art output buffer.

FIG. 3 is a schematic diagram of our inventive output buffer.

FIG. 4 is a graph illustrating output voltage and current versus time for the device of FIG. 3.

DETAILED DESCRIPTION

Figure 5:
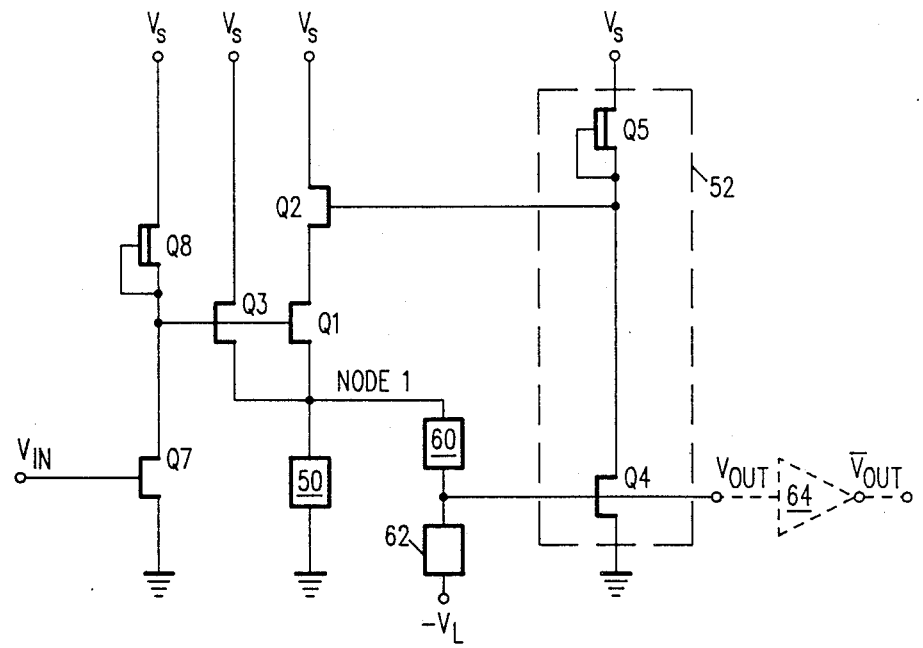
FIG. 5 is a schematic diagram of a more detailed embodiment of our invention.

FIG. 3 shows one embodiment of our inventive output buffer. High current transistor Q1 is coupled to ground through load device 50. If input voltage $V_{in}$, applied to the gate of transistor Q1 is low, transistor Q1 will be turned off and node 1 will be pulled low by load device 50. Load device 50 in the embodiment of FIG. 3 may be a passive device, such as a resistor or other passive current source, or, alternately, may be an active switched load device, such as a transistor. If load device 50 is an active device, the active device must be made conductive when $V_{in}$ is low and nonconductive when $V_{in}$ is high.

Thus, when $V_{in}$ is low, output voltage $V_{out}$, taken from node 1, will also be low. Coupled to node 1 is inverter 52, whose output is connected to the gate of high current transistor Q2.

Transistor Q2 is connected between supply voltage $V_s$ and the drain of transistor Q1. Since output voltage $V_{out}$ is low, a high voltage will be applied by inverter 52, after a short inherent delay by inverter 52, to the gate of transistor Q2. Transistor Q2, after a short inherent delay, will turn on, but will have no effect on output voltage $V_{out}$ since transistor Q1 is nonconductive due to the low $V_{in}$ signal.

Input signal $V_{in}$ is also coupled to the gate of low current transistor Q3 coupled between supply voltage $V_s$ and node 1. Thus transistor Q3 will also be in its off state by the low $V_{in}$ signal.

When input voltage $V_{in}$ now rises from a low state to a high state, this high voltage will turn transistor Q1 on, and since transistor Q2 is already on, from when input voltage $V_{in}$ was in its low state, a high current flows from supply voltage $V_s$ through transistors Q1 and Q2 to node 1. This high current causes the voltage at node 1 to rise. Thus the output buffer provides a high current signal $V_{out}$ to a subsequent stage coupled to node 1.

This high current provided at node 1 quickly charges any parasitic capacitance in the subsequent stage and raises any clamping load in the subsequent stage to the clamping voltage so that the subsequent stage is properly switched.

Meanwhile, the high voltage at node 1 is applied to inverter 52, and, after an inherent delay by inverter 52, a low output of inverter 52 is applied to the gate of transistor Q2. Transistor Q2, after a short inherent delay, then turns off, causing the high current to node 1 to cease. Low current transistor Q3, having been switched on when input voltage $V_{in}$ was raised to its present high voltage state, now provides all the necessary current to node 1 and to the subsequent stage to hold the subsequent stage in its present state.

The combined delay of inverter 52 and transistor Q2 must be greater than or equal to the delay needed to fully set the state of the subsequent stage. One way of insuring that the load of the subsequent stage reaches its threshold voltage before transistor Q2 switches off is to use components for inverter 52 which are identical to those used by the subsequent stage. Thus, as the voltage at node 1 rises, it will pass through the threshold voltage of the subsequent stage before inverter 52 operates to switch off transistor Q2.

A graphic illustration of output voltage $V_{out}$ and output current $I_{out}$ versus time for a high input signal $V_{in}$ occuring at time $t=0$ is shown in FIG. 4. As shown in FIG. 4, when $V_{in}$ goes high at $t=0$, transistor Q1 becomes fully switched on, after an inherent delay of transistor Q1, at time $t=2$. Since transistor Q2 has been previously turned on by a high output of inverter 52 when output voltage $V_{out}$ was in a low state, output currrent $I_{out}$ flows through node 1.

As the voltage $V_{out}$ at node 1 passes through the threshold voltage of the subsequent stage and the threshold voltage of inverter 52 at time $t=1$, the output of inverter 52 goes low. Even after $V_{out}$ has risen sufficiently to switch the subsequent stage, $I_{out}$ keeps rising and levels off at a high current determined by the impedence of the output buffer and subsequent stage.

Output voltage $V_{out}$ is clamped at a voltage determined by the clamping load of the subsequent stage.

At time $t=3$, transistor Q2, switched off by the low output of inverter 52, causes output current $I_{out}$ to descend to the quiescent current provided by low current transistor Q3.

Shown in FIG. 5 is a more detailed embodiment of our invention showing inverter 52 as being comprised of transistors Q4 and Q5. Also shown in FIG. 5 is level shift means 60, which makes the output buffer well suited for GaAs technology since, to prevent any conduction from occurring in N− layer 12 of the GaAs MESFET of FIG. 1, the Schottky diode may need to be reverse biased even with respect to grounded source 14. Thus, the voltage applied to Schottky metal 18 must be a negative voltage supplied by negative voltage source $-V_L$. If the subsequent stage has a MOSFET input device, level shifting means 60 and load device 62 may not be necessary.

In FIG. 5, low current transistors Q7 and Q8 comprise an inverter. Transistor Q7 and depletion type transistor Q8 are connected in series between supply voltage $V_s$ and ground, where the gate of transistor Q8 is connected to its source, and the drain of transistor Q8 is connected to supply voltage $V_s$. Input voltage $V_{in}$ is coupled to the gate of transistor Q7.

The common terminal of transistors Q8 and Q7 are coupled to the gates of low current transistor Q3 and high current transistor Q1. The drain of transistor Q1 is connected to supply voltage $V_s$ through high current transistor Q2. Transistors Q1, Q2, and Q3 operate identically to transistors Q1, Q2, and Q3 in FIG. 3.

Load device 50 is coupled between ground and the source of transistor Q1.

Level shifting means 60 is coupled between node 1 and negative supply voltage $-V_L$ through load device 62. Level shifting means 60 is also coupled to the gate of transistor Q4. Level shifting means 60 may comprise a plurality of diodes connected in series forward biased in the direction from node $V_s$ to $-V_L$. Load device 62 may comprise a depletion type transistor coupled through a resistor to negative voltage $-V_L$, with the gate of the depletion type transistor coupled directly to negative voltage $-V_L$ and the drain of the depletion type transistor connected to level shifting means 60. Thus, incorporating the level shifting means 60 into the embodiment of FIG. 5 enables a negative voltage output into a subsequent stage or a load when node 1 is low. As previously stated, this level shifting may be required for switching GaAs MESFETs.

Inverter means 52 comprising transistors Q4 and Q5 is coupled to the output of level shifting means 60 to provide an inverted voltage to the gate of high current transistor Q2, as previously described with respect to FIGS. 3 and 4.

If the device of FIG. 5 is to provide a noninverted output, an inverting load, shown as inverter 64, must be inserted before a subsequent stage so that a high input voltage $V_{in}$ will produce a high output voltage $V_{out}$.

Figure 6:
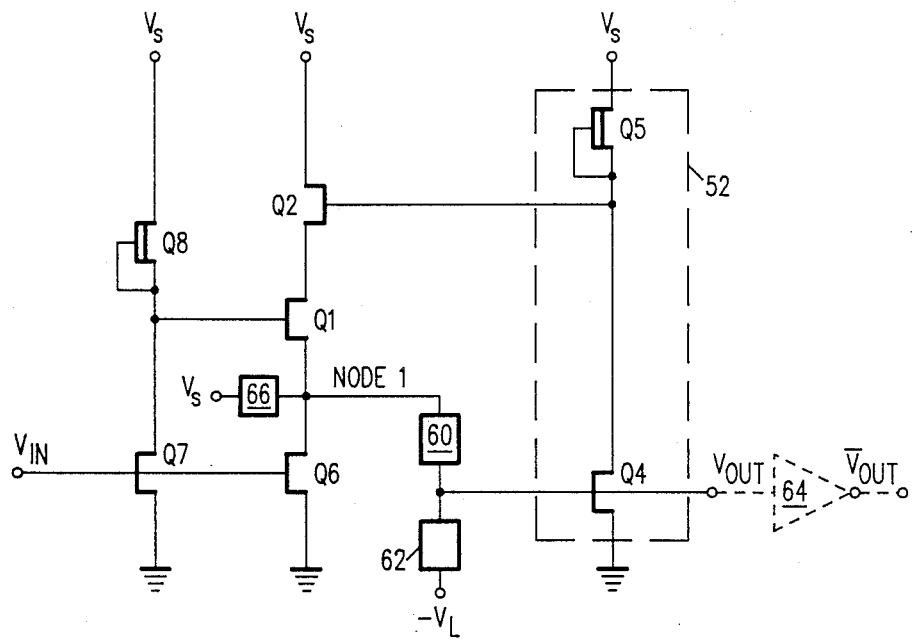
FIG. 6 is a schematic diagram of an additional embodiment of our invention.

FIG. 6 shows an embodiment similar to that of FIG. 5 except that load device 50 is an active device, such as transistor Q6, whose gate is coupled to $V_{in}$. Low current transistor Q3 in FIG. 3 is replaced by a pull-up means 66, which may be a resistor 66 connected to supply voltage $V_s$ or an FET transistor with its gate coupled to its source so as to supply a fixed low current to node 1. Alternately, pull-up means 66 may be a transistor whose control gate is coupled to an inverted $V_{in}$ signal, as in the arrangement of transistor Q3 in FIG. 5.

As is apparent, the invention, generally shown in FIG. 3, may be incorporated in virtually any output buffer to prevent excess current from being supplied to a subsequent stage. All that is needed is for inverter 52, coupled to the output of the output buffer, to have a threshold voltage equal to or exceeding the threshold voltage of the subsequent stage to be controlled.

In one application of the buffers of FIGS. 3, 5, and 6, inverter 52 may actually be a part of a subsequent stage to be switched by the buffer so that a separate inverter 52 is not needed.

While specific embodiments have been disclosed in this specification, these embodiments are merely illustrative of our invention and are not to be construed as limitations of our invention. Other embodiments of our invention will become apparent to those skilled in the art in light of the teachings of our invention.

We claim:

1. A buffer comprising:
   a first transistor having a control terminal connected to receive an input signal, said first transistor having second and third terminals;
   a second transistor having a third terminal coupled to said second terminal of said first transistor and a second terminal coupled to receive a first voltage;
   a load device having a first terminal coupled to said third terminal of said first transistor and a second terminal coupled to a second voltage; and
   a first inverter means coupled between said first terminal of said load device and a control terminal of said second transistor, said first terminal of said load device also for providing a first output signal, said first transistor and said second transistor being of the same conductivity type so as to exhibit complementary logical conducting states after said first inverter means has inverted a signal applied to said first terminal of said load device and applied an inverted signal to said control terminal of said second transistor.

2. The buffer of claim 1 wherein said input signal is an inverted output of a second inverter means, and a second input signal is an input into said second inverter means.

3. The buffer of claim 1 wherein said first and second transistors are capable of providing a high current to said first terminal of said load device.

4. The buffer of claim 1 wherein said first transistor and said second transistor are both switched on when a voltage coupled to said control terminals of said first and second transistors is at a high logical state.

5. A buffer comprising:
   a first transistor having a control terminal connected to receive an input signal, said first transistor having second and third terminals;
   a second transistor having a third terminal coupled to said second terminal of said first transistor and a second terminal coupled to receive a first voltage;
   a load device having a first terminal coupled to said third terminal of said first transistor and a second terminal coupled to a second voltage; and
   a first inverter means coupled between said first terminal of said load device and a control terminal of said second transistor, said first terminal of said load device also for providing a first output signal, wherein said first inverter means has a threshold equal to or greater than a subsequent stage coupled to said first terminal of said load device to insure said subsequent stage is fully switched before said second transistor is biased to be in an off state during operation of the buffer.

6. The buffer of claim 5 wherein said subsequent stage comprises an inverter load.

7. The buffer of claim 6 wherein said first inverter means is said inverter load in said subsequent stage.

8. A buffer comprising:
   a first transistor having a control terminal connected to receive an input signal, said first transistor having second and third terminals;
   a second transistor having a third terminal coupled to said second terminal of said first transistor and a second terminal coupled to receive a first voltage;
   a load device having a first terminal coupled to said third terminal of said first transistor and a second terminal coupled to a second voltage; and
   a first inverter means coupled between said first terminal of said load device and a control terminal of said second transistor, said first terminal of said load device also for providing a first output signal, wherein said load device is a passive pull-down means.

9. The buffer of claim 8 wherein said load device is a resistor.

10. The buffer of claim 8 wherein said load device is a current source.

11. A buffer comprising:
a first transistor having a control terminal connected to receive an input signal, said first transistor having second and third terminals;
a second transistor having a third terminal coupled to said second terminal of said first transistor and a second terminal coupled to receive a first voltage;
a load device having a first terminal coupled to said third terminal of said first transistor and a second terminal coupled to a second voltage;
a first inverter means coupled between said first terminal of said load device and a control terminal of said second transistor, said first terminal of said load device also for providing a first output signal; and
a pull-up means coupled between said first terminal of said load device and said first voltage.

12. The buffer of claim 11 wherein said pull-up means is an active pull-up means comprising a third transistor having a control terminal coupled to receive said input signal, a second terminal coupled to receive said first voltage and a third terminal coupled to said first terminal of said load device, said third transistor for providing quiescent current to said first terminal of said load device.

13. A buffer comprising:
a first transistor having a control terminal connected to receive an input signal, said first transistor having second and third terminals;
a second transistor having a third terminal coupled to said second terminal of said first transistor and a second terminal coupled to receive a first voltage;
a load device having a first terminal coupled to said third terminal of said first transistor and a second terminal coupled to a second voltage; and
a first inverter means coupled between said first terminal of said load device and a control terminal of said second transistor, said first terminal of said load device also for providing a first output signal,
wherein said first inverter is coupled to said first terminal of said load device through a level shift means, said level shift means having a first terminal coupled to said first terminal of said load device and a second terminal coupled to said first inverter means, said second terminal of said level shift means also being coupled to a third voltage through a second load device, said level shift means providing a level shifted second output signal.

14. A buffer comprising:
a first transistor having a control terminal connected to receive an input signal, said first transistor having second and third terminals;
a second transistor having a third terminal coupled to said second terminal of said first transistor and a second terminal coupled to receive a first voltage;
a load device having a first terminal coupled to said third terminal of said first transistor and a second terminal coupled to a second voltage; and a first inverter means coupled between said first terminal of said load device and a control terminal of said second transistor, said first terminal of said load device also for providing a first output signal,
wherein said first inverter means comprises a third transistor and a fourth transistor, said third transistor having a second terminal coupled to said first voltage and a third terminal coupled to its control terminal, said third terminal of said third transistor also being coupled to said control terminal of said second transistor, said third terminal of said third transistor also being coupled to a second terminal of said fourth transistor, a third terminal of said fourth transistor being coupled to receive said second voltage, a control terminal of said fourth transistor being couple to said first terminal of said load device.

15. A buffer comprising:
a first transistor having a control terminal connected to receive an input signal, said first transistor having second and third terminals;
a second transistor having a third terminal coupled to said second terminal of said first transistor and a second terminal coupled to receive a first voltage;
a load device having a first terminal coupled to said third terminal of said first transistor and a second terminal coupled to a second voltage; and
a first inverter means coupled between said first terminal of said load device and a control terminal of said second transistor, said first terminal of said load device also for providing a first output signal,
wherein a subsequent stage coupled to said first terminal of said load device is of the type which clamps a voltage applied to said subsequent stage to a predetermined level.

16. A buffer comprising:
a first transistor having a control terminal connected to receive an input signal, said first transistor having second and third terminals;
a second transistor having a third terminal coupled to said second terminal of said first transistor and a second terminal coupled to receive a first voltage;
a load device having a first terminal coupled to said third terminal of said first transistor and a second terminal coupled to a second voltage; and
a first inverter means coupled between said first terminal of said load device and a control terminal of said second transistor, said first terminal of said load device also for providing a first output signal,
wherein said load device is an active pull-down means comprising a third transistor with a control terminal coupled to receive an inverted input signal, a second terminal coupled to said third terminal of said first transistor, and a third terminal coupled to said second voltage, said second terminal of said third transistor for providing said first output signal.

17. The buffer of claim 16 further comprising a pull-up means coupled between said second terminal of said third transistor and said first voltage.

18. The buffer of claim 17 wherein said pull-up means is an active pull-up means comprising a fourth transistor having a control terminal coupled to receive said input signal, a second terminal coupled to receive said first voltage and a third terminal coupled to said second terminal of said third transistor, said fourth transistor for providing quiescent current to said second terminal of said third transistor.

19. The buffer of claim 17 wherein said first inverter is coupled to said second terminal of said third transistor through a level shift means, said level shift means having a first terminal coupled to said second terminal of said third transistor and a second terminal coupled to said first inverter means, said second terminal of said level shift means also being coupled to a third voltage through a second load device, said level shift means providing a level shifted second output signal.

20. The buffer of claim 17 wherein said input signal is an inverted output of a second inverter means, and a second input signal is an input into said second inverter means.

21. The buffer of claim 17 wherein said first inverter means comprises a fifth transistor and a sixth transistor, said fifth transistor having a second terminal coupled to said first voltage and a third terminal coupled to its control terminal, said third terminal of said fifth transistor also being coupled to said control terminal of said second transistor, said third terminal of said fifth transistor also being coupled to a second terminal of said sixth transistor, a third terminal of said sixth transistor being coupled to receive said second voltage, a control terminal of said sixth transistor being coupled to said second terminal of said third transistor.

22. The buffer of claim 17 wherein said first and second transistors are capable of providing a high current to said second terminal of said third transistor.

23. The buffer of any one of claims 1 through 22 wherein all of said transistors are FET's.

24. The buffer of any one of claims 1 through 22 wherein all of said transistors are formed using compound semiconductor technology.

25. The buffer of any one of claims 1 through 22 wherein all of said transistors are formed using GaAs technology.

26. The buffer of any one of claims 1 through 22 wherein all of said transistors are MESFET's.

27. The buffer of any one of claims 1 through 22 wherein all of said transistors are GaAs MESFET's.

* * * * *